United States Patent
Fukuzumi et al.

(10) Patent No.: US 8,199,573 B2
(45) Date of Patent: Jun. 12, 2012

(54) NONVOLATILE SEMICONDUCTOR MEMORY DEVICE

(75) Inventors: Yoshiaki Fukuzumi, Yokohama (JP); Ryota Katsumata, Yokohama (JP); Masaru Kito, Yokohama (JP); Masaru Kidoh, Komae (JP); Hiroyasu Tanaka, Tokyo (JP); Tomoko Fujiwara, Yokohama (JP); Megumi Ishiduki, Yokohama (JP); Yosuke Komori, Yokohama (JP); Yoshimasa Mikajiri, Yokohama (JP); Shigeto Oota, Yokohama (JP); Ryouhei Kirisawa, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 12/694,677

(22) Filed: Jan. 27, 2010

(65) Prior Publication Data

US 2011/0075481 A1 Mar. 31, 2011

(30) Foreign Application Priority Data

Sep. 25, 2009 (JP) ................................ 2009-220985

(51) Int. Cl.
*G11C 11/34* (2006.01)
*G11C 16/04* (2006.01)
(52) U.S. Cl. .............................. 365/185.05; 365/185.17
(58) Field of Classification Search .............. 365/185.05, 365/185.17, 185.18
See application file for complete search history.

(56) References Cited

U.S. PATENT DOCUMENTS

| | | | | |
|---|---|---|---|---|
| 6,175,522 B1 * | 1/2001 | Fang | .................. | 365/185.18 |
| 7,227,782 B2 * | 6/2007 | Lee et al. | .................. | 365/185.17 |
| 7,606,075 B2 * | 10/2009 | Aritome et al. | .......... | 365/185.18 |
| 2006/0215477 A1 | 9/2006 | Yano et al. | | |
| 2007/0252201 A1 | 11/2007 | Kito et al. | | |
| 2008/0160680 A1 * | 7/2008 | Yuan | .............................. | 438/129 |
| 2008/0173933 A1 | 7/2008 | Fukuzumi et al. | | |
| 2011/0127597 A1 | 6/2011 | Fukuzumi et al. | | |

FOREIGN PATENT DOCUMENTS

| | | |
|---|---|---|
| JP | 11-176175 | 7/1999 |
| JP | 2004-030866 | 1/2004 |
| JP | 2004-241558 | 8/2004 |
| JP | 2007-266143 | 10/2007 |

(Continued)

OTHER PUBLICATIONS

U.S. Appl. No. 12/501,142, filed Jul. 10, 2009, Yoshiaki Fukuzumi et al.

(Continued)

*Primary Examiner* — Anh Phung

(74) *Attorney, Agent, or Firm* — Oblon, Spivak, McClelland, Maier & Neustadt, L.L.P.

(57) ABSTRACT

A nonvolatile semiconductor memory device comprises: a bit line; a source line; a memory string having a plurality of electrically data-rewritable memory transistors connected in series; a first select transistor provided between one end of the memory string and the bit line; a second select transistor provided between the other end of the memory string and the source line; and a control circuit configured to control a read operation. A plurality of the memory strings connected to one bit line via a plurality of the first select transistors. During reading of data from a selected one of the memory strings, the control circuit renders conductive the first select transistor connected to an unselected one of the memory strings and renders non-conductive the second select transistor connected to unselected one of the memory strings.

20 Claims, 8 Drawing Sheets

FOREIGN PATENT DOCUMENTS

| | | |
|---|---|---|
| JP | 2008-310949 | 12/2008 |
| JP | 2009-518774 | 5/2009 |
| JP | 2009-146954 | 7/2009 |
| WO | WO 2009/075370 A1 | 6/2009 |
| WO | WO 2010/004706 A1 | 1/2010 |

OTHER PUBLICATIONS

U.S. Appl. No. 12/679,991, filed Mar. 25, 2010, Fukuzumi et al.
Korean Office Action issued on Mar. 8, 2011 in corresponding Korean Application No. 10-2009-133740 (with an English Translation).
Takashi Maeda et al., "Multi-Stacked 1G Cell/Layer Pipe-Shaped BiCS Flash Memory", 2009 Symposium on VLSI Circuits, Digest of Technical Papers, Jun. 16-18, 2009, pp. 22-23.
Ryota Katsunmata et al., Pipe-Shaped BiCS Flash Memory with 16 Stacked Layers and Multi-Level-Cell Operation for Ultra High Density Storage Devices, 2009 Symposium on VLSI Circuits, Digest of Technical Papers, Jun. 16-18, 2009, pp. 136-137.
Office Action (with English translation) issued on Jan. 31, 2012, in counterpart Japanese Appln. No. 2009-220985 (9 pages).
Office Action issued Apr. 17, 2012 in Japanese Patent Application No. 2009-220985 filed Sep. 25, 2009 (with English translation).

* cited by examiner

NONVOLATILE SEMICONDUCTOR MEMORY DEVICE

CROSS REFERENCE TO RELATED APPLICATIONS

This application is based upon and claims the benefit of priority from the prior Japanese Patent Application No. 2009-220985, filed on Sep. 25, 2009, the entire contents of which are incorporated herein by reference.

BACKGROUND OF THE INVENTION

1. Field of the Invention

The present invention relates to an electrically data-rewritable nonvolatile semiconductor memory device.

2. Description of the Related Art

An example of a conventional technology for realizing increasingly high density levels in memory without relying on lithography is a structure in which one time-programmable elements are sandwiched between multilayer wiring. Additionally, there is a structure in which epitaxial growth of a silicon film is repeated, whereby a conventional NAND flash memory is formed in multiple layers, and so on. However, these conventional structures have a problem that a number of lithography executions increases along with an increase in a number of stacking layers.

Disclosed as a structure for solving the above-described problem is a three-dimensional semiconductor memory device having memory cells disposed three-dimensionally therein (refer to Japanese Unexamined Patent Application Publication No. 2007-266143, and Japanese Unexamined Patent Application Publication No. 2009-146954). Features of this semiconductor memory device lie in its method of manufacture described below. That is, first, a hole is opened through the stacked electrodes in a single step, and a memory film is formed on an inner wall of the hole. Next, an inside of the hole is filled with a polysilicon film. This method of manufacture enables a memory string constituted by stacked memory elements to be formed at one time. Furthermore, this method of manufacture allows realization of a memory in which, even if the number of stacking layers is increased, there is almost no increase in a number of lithography processes.

However, in the case of the above-described three-dimensional semiconductor memory device, a number of strings connected to one bit line, at several thousand or more, is generally extremely large compared to a conventional two-dimensional semiconductor memory device (planar-type device). As a result, if a leak current from several thousands of unselected strings is not reduced to the utmost, it is difficult to read a selected cell correctly. Specifically, when a gate voltage of a select transistor is 0 V, it is necessary to curb a permissible value of the leak current to an extremely low level of about 0.1 pA per string.

By contrast, in an erase operation of the above-described three-dimensional semiconductor memory device, an intense electric field is produced in a vicinity of the select transistor, causing holes to be generated. And, for erase, it is necessary that these holes be pulled into a body of the memory cell. For example, it is estimated that, when the gate voltage of the select transistor is lower than a drain voltage thereof by 5V, a current due to the holes must be at least about 100 pA per string.

The leak current is reduced by lowering an impurity concentration in the body of the select transistor. By contrast, a hole current is sufficiently generated by increasing the impurity concentration in the body of the select transistor. That is, with respect to setting of the impurity concentration in the body of the select transistor, there is a trade-off between elimination of the leak current and generation of the hole current.

SUMMARY OF THE INVENTION

In accordance with a first aspect of the present invention, a nonvolatile semiconductor memory device, comprising: a bit line; a source line; a memory string having a plurality of electrically data-rewritable memory transistors connected in series; a first select transistor provided between one end of the memory string and the bit line; a second select transistor provided between another end of the memory string and the source line; and a control circuit configured to control a read operation, a plurality of the memory strings being connected to one bit line via a plurality of the first select transistors, the memory string comprising: a first semiconductor layer including a columnar portion extending in a stacking direction on a substrate and functioning as a body of the memory transistors; a first charge storage layer surrounding the columnar portion and holding data of the memory transistors by storing a charge; and a plurality of first conductive layers stacked on the substrate so as to surround the first charge storage layer and functioning as gates of the memory transistors, the first select transistor comprising: a second semiconductor layer in contact with an end of the columnar portion and extending in the stacking direction, and functioning as a body of the first select transistor; a first gate insulating layer surrounding the second semiconductor layer; and a second conductive layer surrounding the first gate insulating layer and functioning as a gate of the first select transistor, and the second select transistor comprising: a third semiconductor layer in contact with an end of the columnar portion and extending in the stacking direction, and functioning as a body of the second select transistor; a second gate insulating layer surrounding the third semiconductor layer; and a third conductive layer surrounding the second gate insulating layer and functioning as a gate of the second select transistor, during reading of data from a selected one of the memory strings, the control circuit being configured to render conductive the first select transistor connected to an unselected one of the memory strings and render non-conductive the second select transistor connected to unselected one of the memory strings.

In accordance with a second aspect of the present invention, a nonvolatile semiconductor memory device, comprising: a bit line; a source line; a memory string having a plurality of electrically data-rewritable memory transistors connected in series; a first select transistor provided between one end of the memory string and the bit line; a second select transistor provided between another end of the memory string and the source line; and a control circuit configured to control a read operation, a plurality of the memory strings being connected to one bit line via a plurality of the first select transistors, the memory string comprising: a first semiconductor layer including a columnar portion extending in a stacking direction on a substrate and functioning as a body of the memory transistors; a first charge storage layer surrounding the columnar portion and holding data of the memory transistors by storing a charge; and a plurality of first conductive layers stacked on the substrate so as to surround the first charge storage layer and functioning as gates of the memory transistors, the first select transistor comprising: a second semiconductor layer in contact with an end of the columnar portion and extending in the stacking direction, and functioning as a body of the first select transistor; a first gate insulating layer surrounding the second semiconductor layer; and a second conductive layer surrounding the first gate insulating layer and functioning as a gate of the first select transistor, and the second select transistor comprising: a third semiconductor layer in contact with an end of the columnar portion and extending in the stacking direction, and functioning as a body of the second select transistor; a second gate insulating layer surrounding the third semiconductor layer; and a third conductive layer surrounding the second gate insulating layer and functioning as a gate of the second select transistor, during reading of data from a selected one of the memory strings, the control circuit being configured to first render non-conductive the first select transistor and the second select transistor connected to an unselected one of the memory strings, and then apply a first voltage to a gate of the memory transistors included in the unselected one of the memory strings, thereby boosting the body of the memory transistors included in the unselected one of the memory strings by capacitive coupling.

DETAILED DESCRIPTION OF THE EMBODIMENTS

Embodiments of a nonvolatile semiconductor memory device in accordance with the present invention are described below with reference to the drawings.

[First Embodiment]
[Configuration]

Figure 1:
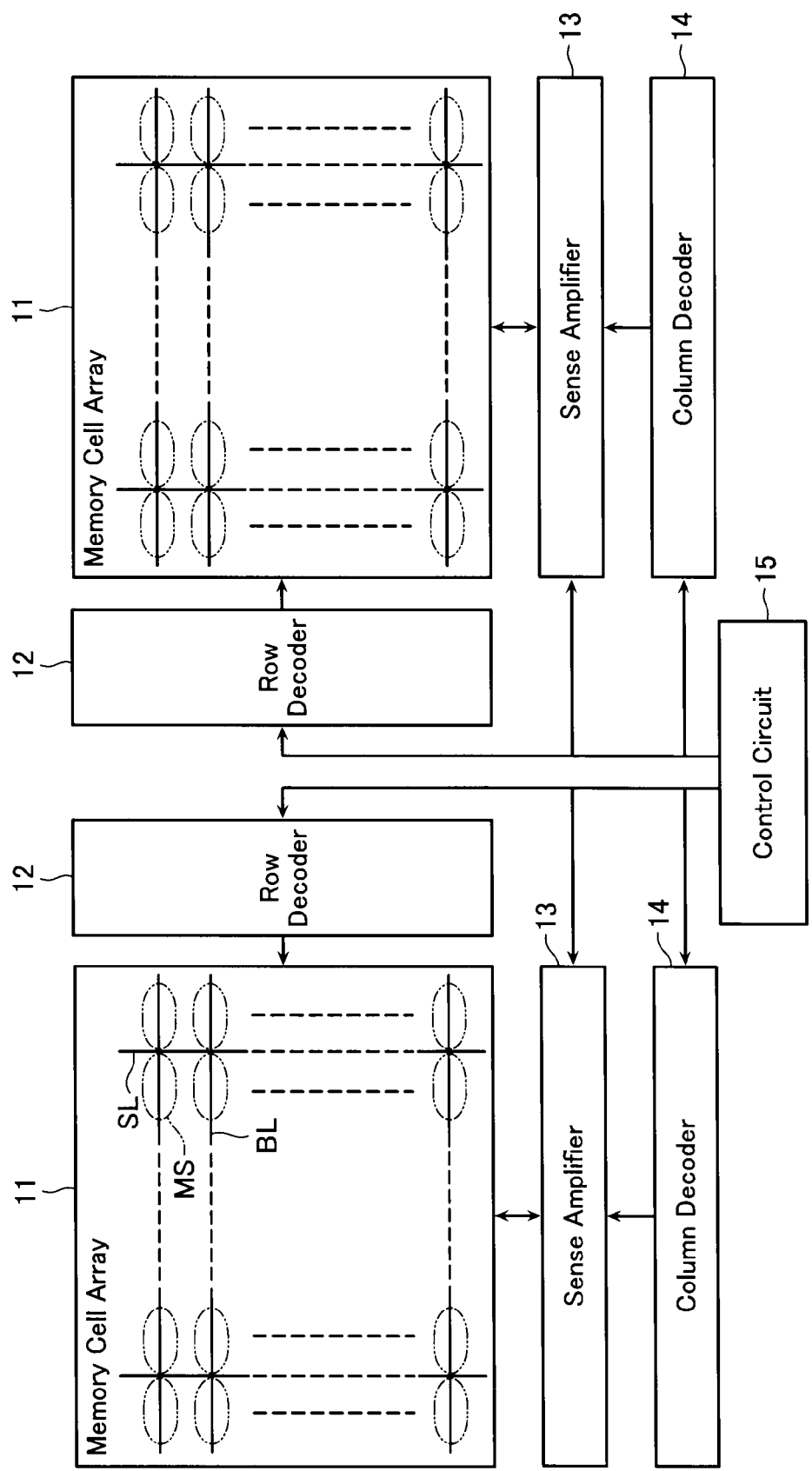
FIG. 1 is a block diagram of a nonvolatile semiconductor memory device in accordance with a first embodiment of the present invention.

First, an overall configuration of a nonvolatile semiconductor memory device in accordance with a first embodiment is described with reference to FIG. 1. FIG. 1 is a block diagram of the nonvolatile semiconductor memory device in accordance with the first embodiment of the present invention.

As shown in FIG. 1, the nonvolatile semiconductor memory device in accordance with the first embodiment comprises a memory cell array 11, a row decoder 12, a sense amplifier 13, a column decoder 14, and a control circuit 15. In the example shown in FIG. 1, there are two memory cell arrays 11, but two or more may be further provided. The row decoder 12, the sense amplifier 13, and the column decoder 14 are respectively provided one to each of the memory cell arrays 11.

Figure 2:
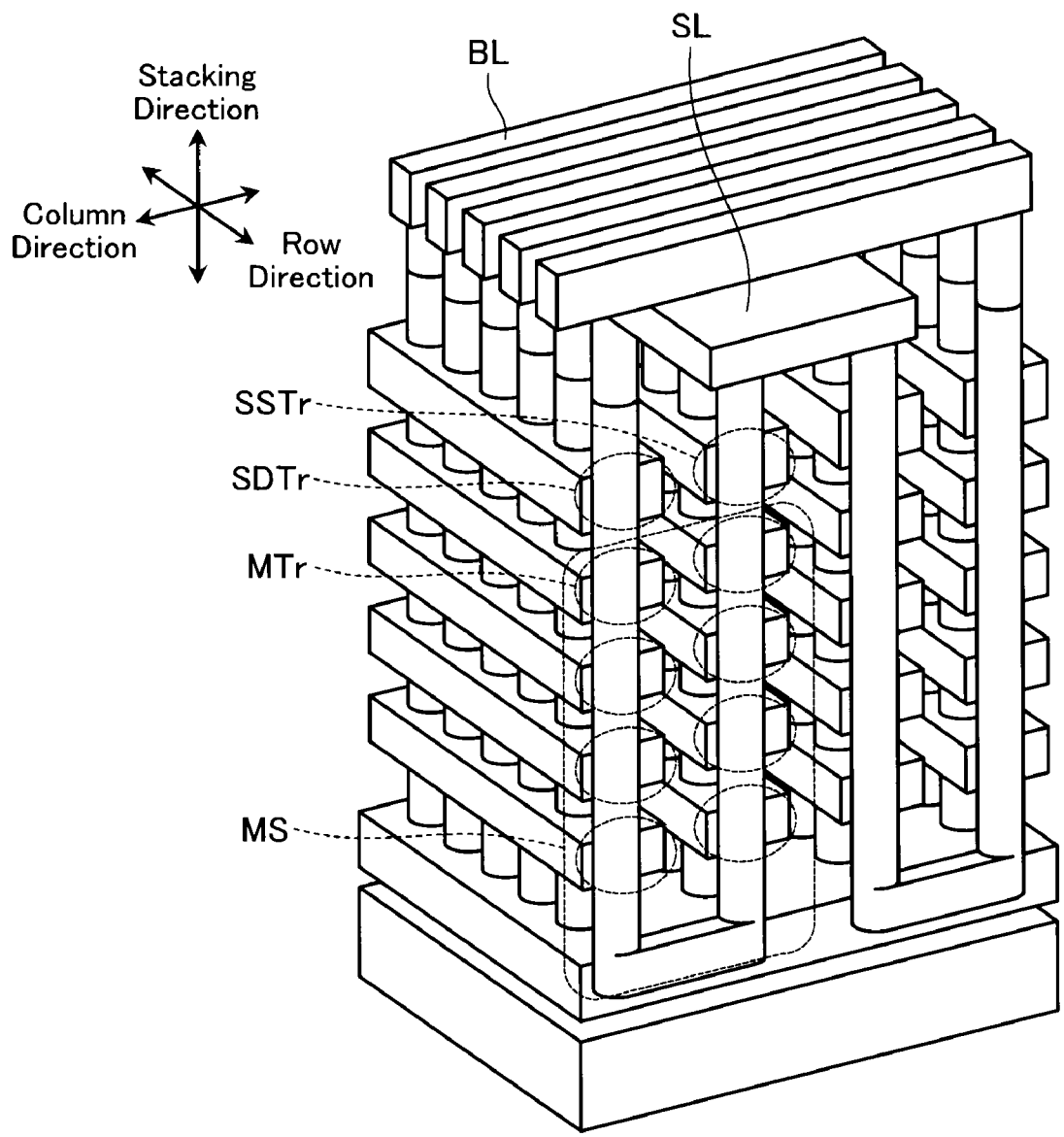
FIG. 2 is a schematic perspective view of a memory cell array 11.

As shown in FIG. 1, the memory cell array 11 includes a plurality of bit lines BL, a plurality of source lines SL configured to cross the bit lines BL, and a plurality of memory strings MS each having a plurality of electrically rewritable memory transistors MTr connected in series. As shown in FIG. 2, the memory cell array 11 is configured having the electrically data-storing memory transistors MTr arranged in a three-dimensional matrix. That is, the memory transistors MTr, as well as being arranged in a matrix in a horizontal direction, are also arranged in a stacking direction. The plurality of memory transistors MTr aligned in the stacking direction are connected in series to configure the memory string MS. Connected to the two ends of the memory string MS are, respectively, a drain side select transistor SDTr and a source side select transistor SSTr, which are rendered conductive when selected. The memory string MS is arranged having the stacking direction as a long direction. The drain side select transistor SDTr has one end thereof connected to the bit line BL. The source side select transistor SSTr has one end thereof connected to the source line SL.

As shown in FIG. 1, the row decoder 12 decodes a block address signal and so on downloaded thereto, and controls the memory cell array 11. The sense amplifier 13 reads data from the memory cell array 11. The column decoder 14 decodes a column address signal and controls the sense amplifier 13. The control circuit 15 boosts a power supply voltage to generate a high voltage required during write and erase, and, further, generates a control signal to control the row decoder 12, the sense amplifier 13, and the column decoder 14.

Next, a circuit configuration of the memory cell array 11 is described with reference to FIG. 3. FIG. is an equivalent circuit diagram of the memory transistors MTr, the drain side select transistor SDTr, the source side select transistor SSTr, and a peripheral circuit thereof, formed along a cross-section in a column direction of the memory cell array 11.

Figure 3:
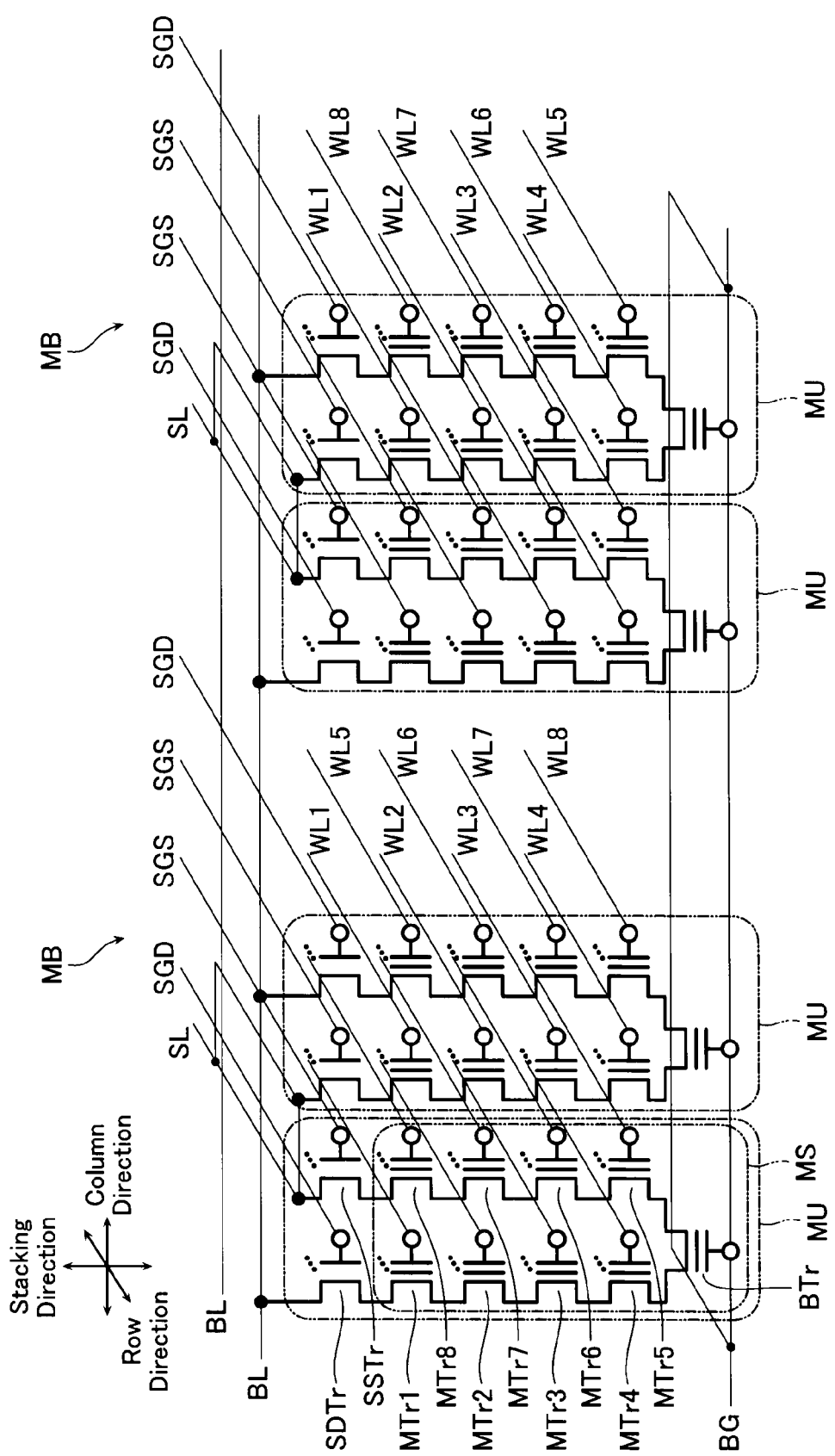
FIG. 3 is an equivalent circuit diagram of the memory cell array 11.

As shown in FIG. 3, the memory cell array 11 includes the plurality of bit lines BL and a plurality of memory blocks MB. The bit lines BL are formed in stripes extending in the column direction and having a certain pitch in a row direction. The memory blocks MB are provided repeatedly in the column direction with a certain pitch.

As shown in FIG. 3, the memory block MB includes a plurality of memory units MU arranged in a matrix in the row direction and the column direction. A plurality of the memory units MU are provided so that the plurality of the memory units MU are commonly connected to one bit line BL. The memory unit MU includes the memory string MS, the source side select transistor SSTr, and the drain side select transistor SDTr. The memory units MU adjacent in the column direction are formed such that a configuration thereof is mutually symmetrical in the column direction. The memory units MU are arranged in a matrix in the row direction and the column direction.

The memory string MS is configured by memory transistors MTr1-MTr8 and a back gate transistor BTr connected in series. The memory transistors MTr1-MTr4 are connected in series in the stacking direction. The memory transistors MTr5-MTr8 also are similarly connected in series in the stacking direction. The memory transistors MTr1-MTr8 store information by trapping a charge in a charge storage layer. The back gate transistor BTr is connected between the lowermost layer memory transistors MTr4 and MTr5. The memory transistors MTr1-MTr8 and the back gate transistor BTr are thus connected in a U shape in a cross-section in the column direction. A source of the drain side select transistor SDTr is connected to one end of the memory string MS (a drain of the memory transistor MTr1). A drain of the source side select transistor SSTr is connected to another end of the memory string MS (a source of the memory transistor MTr8).

Gates of the memory transistors MTr1 in the memory units MU in one memory block MB are commonly connected to a word line WL1. Similarly, gates of the memory transistors MTr2-MTr8 in one memory block MB are commonly connected to word lines WL2-WL8, respectively. Moreover, gates of the back gate transistors BTr arranged in a matrix in the row direction and the column direction are commonly connected to a back gate line BG.

Gates of each of the drain side select transistors SDTr in the memory units MU arranged in a line in the row direction are commonly connected to a drain side select gate line SGD extending in the row direction. Moreover, drains of the drain side select transistors SDTr arranged in a line in the column direction are commonly connected to the bit line BL.

Gates of each of the source side select transistors SSTr in the memory units MU arranged in a line in the row direction are commonly connected to a source side select gate line SGS extending in the row direction. Moreover, in pairs of the memory units MU adjacent in the column direction, sources of the source side select transistors SSTr arranged in a line in the row direction are commonly connected to the source line SL extending in the row direction.

Figure 4:
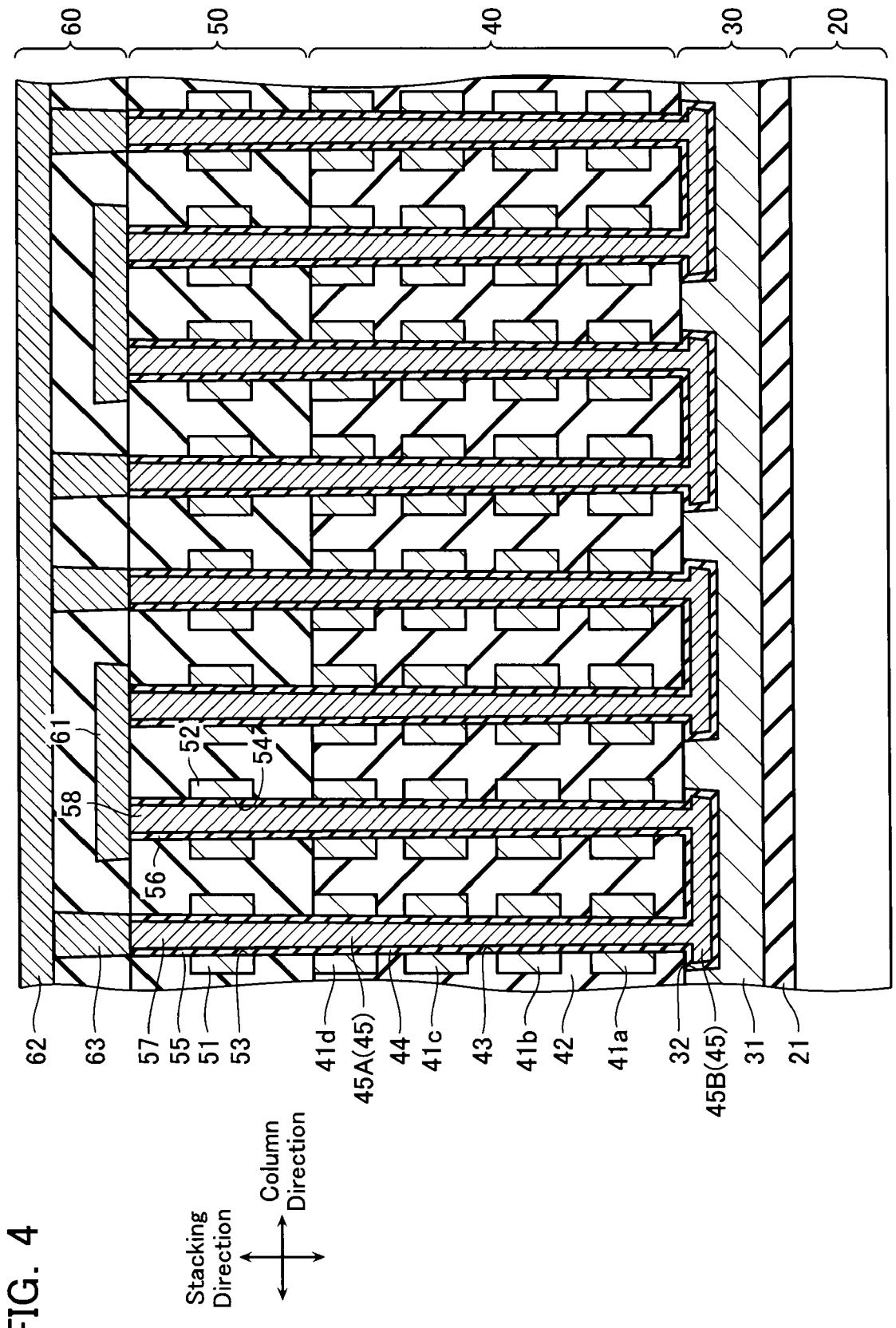
FIG. 4 is a cross-sectional view of the memory cell array 11.
Figure 5:
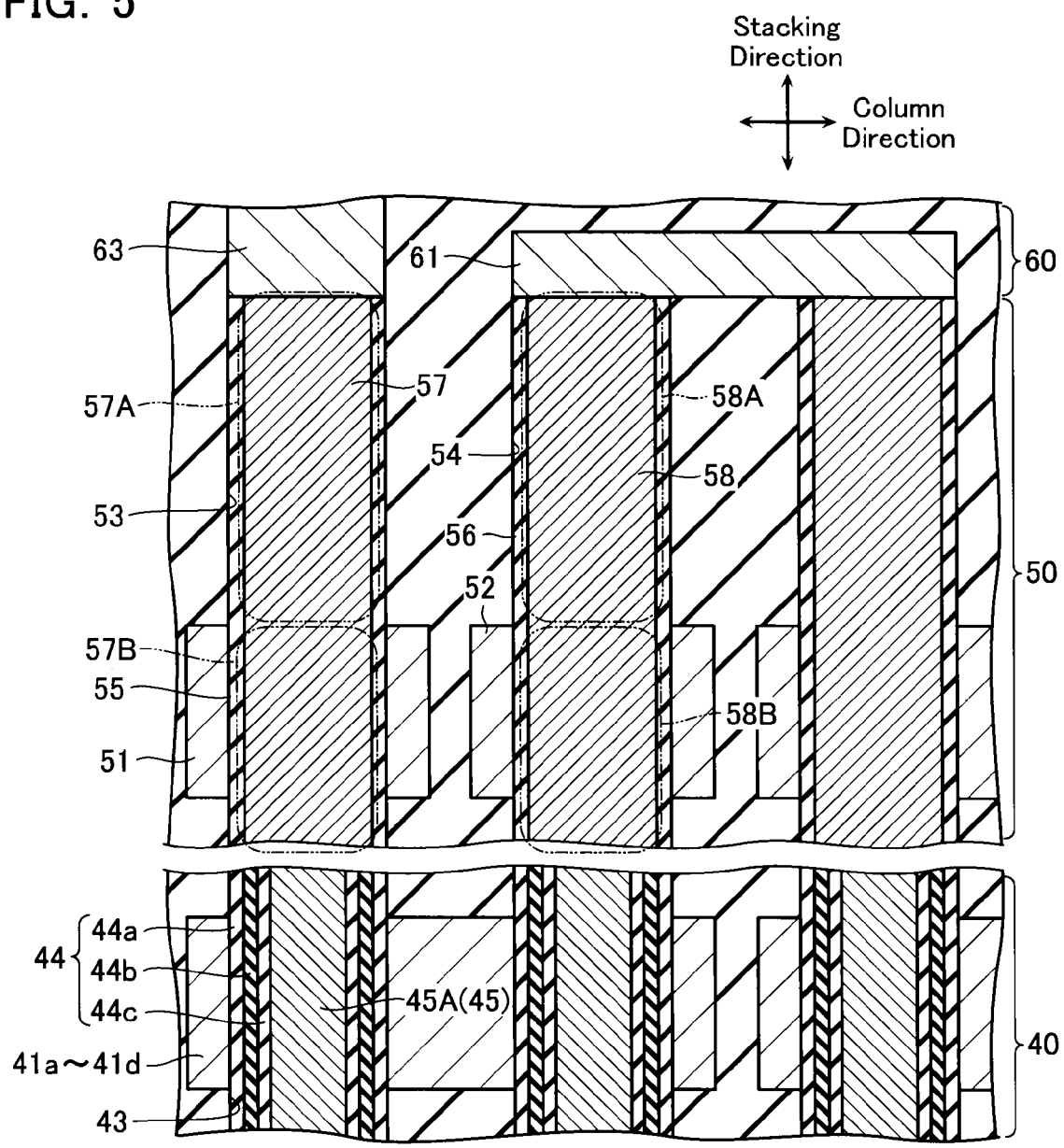
FIG. 5 is an enlarged view of FIG. 4.

Next, a stacking structure of the memory cell array configured to realize the circuit configuration shown in FIG. 3 is described with reference to FIGS. 4 and 5. FIG. 4 is a cross-sectional view of the memory cell array 11 in accordance with the first embodiment, and FIG. 5 is an enlarged view of FIG. 4.

As shown in FIG. 4, the memory cell array 11 includes a substrate 20, and, sequentially from a lower layer, a back gate layer 30, a memory transistor layer 40, a select transistor layer 50, and a wiring layer 60. The back gate layer 30 functions as the back gate transistor BTr. The memory transistor layer 40 functions as the memory transistors MTr1-MTr8. The select transistor layer 50 functions as the drain side select transistor SDTr and the source side select transistor SSTr. The wiring layer 60 functions as the source line SL and the bit line BL.

The back gate layer 30 includes a back gate conductive layer 31 formed on the substrate with an insulating layer 21 interposed therebetween, as shown in FIG. 4. The back gate conductive layer 31 functions as the back gate line BG and as a gate of the back gate transistor BTr. The back gate conductive layer 31 is formed in a planar shape extending in the row direction and the column direction. The back gate conductive layer 31 covers a lower surface and a side surface of a joining portion 45B of a U-shaped semiconductor layer 45 to be described hereafter, and is formed to the same height as an upper surface of the joining portion 45B. The back gate conductive layer 31 is constituted by polysilicon (poly-Si).

In addition, the back gate layer 30 includes a back gate hole 32 formed so as to dig out the back gate conductive layer 31, as shown in FIG. 4. The back gate hole 32 is configured as an opening having a short side in the row direction and a long side in the column direction. The back gate hole 32 is formed in a matrix at certain intervals in the row direction and the column direction.

The memory transistor layer 40 includes word line conductive layers 41a-41d formed in the stacking direction with an insulating layer 42 interposed therebetween, as shown in FIG. 4. The word line conductive layers 41a-41d function as word lines WL1-WL8 and as a gate of the memory transistors MTr1-MTr8. The word line conductive layers 41a-41d are divided into memory blocks MB and are formed in a pair of comb-tooth shapes opposing in the row direction. The word line conductive layers 41a-41d include a portion formed in stripes extending in the row direction and having a certain pitch in the column direction. The word line conductive layers 41a-41d are constituted by polysilicon (poly-Si).

In addition, the memory transistor layer 40 includes a memory hole 43 formed so as to penetrate the word line conductive layers 41a-41d and the insulating layer 42, as shown in FIG. 4.

The memory hole 43 is formed so as to be aligned with a position of the two end vicinities in the column direction of each back gate hole 32. The memory hole 43 is formed in a matrix in the row direction and the column direction.

In addition, the above-described back gate layer 30 and memory transistor layer 40 include a memory gate insulating layer 44 and the U-shaped semiconductor layer 45, as shown in FIG. 4. The U-shaped semiconductor layer 45 functions as a body of the memory transistors MTr1-MTr8 and the back gate transistor BTr.

The memory gate insulating layer 44 is formed on a side surface facing the memory hole 43 and the back gate hole 32, as shown in FIG. 4. The memory gate insulating layer 44 is configured by a block insulating layer 44a, a charge storage layer 44b, and a tunnel insulating layer 44c, as shown in FIG. 5. The block insulating layer 44a is formed along the side surface of the memory hole 43 and the back gate hole 32 so as to be in contact with the word line conductive layers 41a-41d and the back gate conductive layer 31. The block insulating layer 44a is constituted by silicon oxide (SiO$_2$). The charge storage layer 44b is formed on a side surface of the block insulating layer 44a. The charge storage layer 44b is used to store a charge, thereby holding data of the memory transistors MTr1-MTr8. The charge storage layer 44b is constituted by silicon nitride (SiN). The tunnel insulating layer 44c is formed on a side surface of the charge storage layer 44b. The tunnel insulating layer 44c is constituted by silicon oxide (SiO$_2$).

The U-shaped semiconductor layer 45 is formed in a U shape as viewed from the row direction. The U-shaped semiconductor layer 45 is formed so as to be in contact with a side surface of the tunnel insulating layer 44c and so as to fill the back gate hole 32 and the memory hole 43. The U-shaped semiconductor layer 45 includes a pair of columnar portions 45A extending in a perpendicular direction with respect to the substrate 20 as viewed from the row direction, and the joining portion 45B formed so as to join lower ends of the pair of columnar portions 45A. The U-shaped semiconductor layer 45 is constituted by polysilicon (poly-Si).

Expressing the above-described configuration of the memory transistor layer 40 in other words, the tunnel insulating layer 44c is formed so as to surround a side surface of the columnar portion 45A. The charge storage layer 44b is formed so as to surround a side surface of the tunnel insulating layer 44c. The block insulating layer 44a is formed so as to surround a side surface of the charge storage layer 44b. The word line conductive layers 41a-41d are formed so as to surround a side surface of the block insulating layer 44a.

The select transistor layer 50 includes a drain side conductive layer 51 and a source side conductive layer 52 formed in the same layer as the drain side conductive layer 51, as shown in FIG. 4. The drain side conductive layer 51 functions as the drain side select gate line SGD and as a gate of the drain side select transistor SDTr. The source side conductive layer 52 functions as the source side select gate line SGS and as a gate of the source side select transistor SSTr.

The drain side conductive layer 51 and the source side conductive layer 52 are formed in stripes extending in the row direction and having a certain pitch in the column direction. A pair of the drain side conductive layer 51 and a pair of the source side conductive layer 52 are provided alternately in the column direction. The drain side conductive layer 51 and the source side conductive layer 52 are constituted by polysilicon (poly-Si).

In addition, the select transistor layer 50 includes a drain side hole 53 and a source side hole 54, as shown in FIG. 4. The drain side hole 53 is formed so as to penetrate the drain side conductive layer 51. The source side hole 54 is formed so as to penetrate the source side conductive layer 52. The drain side hole 53 and the source side hole 54 are formed at a position aligning with the memory hole 43.

Moreover, the select transistor layer 50 includes a drain side gate insulating layer 55, a source side gate insulating layer 56, a drain side columnar semiconductor layer 57, and a source side columnar semiconductor layer 58, as shown in FIG. 4. The drain side columnar semiconductor layer 57 functions as a body of the drain side select transistor SDTr. The source side columnar semiconductor layer 58 functions as a body of the source side select transistor SSTr.

The drain side gate insulating layer 55 is formed on a side surface of the drain side hole 53. The source side gate insulating layer 56 is formed on a side surface of the source side hole 54. The drain side gate insulating layer 55 and the source side gate insulating layer 56 are constituted by silicon oxide ($SiO_2$).

The drain side columnar semiconductor layer 57 is formed in a column shape extending in the stacking direction and in contact with the drain side gate insulating layer 55, and so as to fill the drain side hole 53. The source side columnar semiconductor layer 58 is formed in a column shape extending in the stacking direction and in contact with the source side gate insulating layer 56, and so as to fill the source side hole 54. The drain side columnar semiconductor layer 57 and the source side columnar semiconductor layer 58 are constituted by polysilicon (poly-Si).

Moreover, an impurity concentration in an upper portion 57A of the drain side columnar semiconductor layer 57 is higher than in a lower portion 57B thereof, as shown in FIG. 5. Here, the upper portion 57A means a side above an upper end of the drain side conductive layer 51 and near a second wiring layer 62 (bit line BL). The lower portion 57B means a side below the upper portion 57A of the drain side conductive layer 51 and near the columnar portion 45A (U-shaped semiconductor layer 45). The impurity concentration of the upper portion 57A is $1 \times 10^{19}$ $cm^{-3}$ or more, and preferably $3 \times 10^{19}$ $cm^{-3}$ or more. The impurity concentration of the lower portion 57B is lower than that of the upper portion 57A by an order of magnitude or more, and is $3 \times 10^{18}$ $cm^{-3}$. Note that an upper portion 58A and a lower portion 58B of the source side columnar semiconductor layer 58 also have an impurity concentration similar to that of the drain side columnar semiconductor layer 57.

The upper portions 57A and 58A are set to the above-described concentration to facilitate generation of a GIDL current during an erase operation. However, on the other hand, the setting of such a concentration causes cut-off characteristics in the drain side select transistor SDTr to deteriorate. The present embodiment solves the above-described problem of the cut-off characteristics by performing a read method to be described hereafter.

Expressing the above-described configuration of the select transistor layer 50 in other words, the drain side gate insulating layer 55 is formed so as to surround a side surface of the drain side columnar semiconductor layer 57. The drain side conductive layer 51 is formed so as to surround a side surface of the drain side gate insulating layer 55. The source side gate insulating layer 56 is formed so as to surround a side surface of the source side columnar semiconductor layer 58. The source side conductive layer 52 is formed so as to surround a side surface of the source side gate insulating layer 56.

The wiring layer 60 includes a first wiring layer 61, a second wiring layer 62, and a plug layer 63, as shown in FIG. 4. The first wiring layer 61 functions as the source line SL. The second wiring layer 62 functions as the bit line BL.

The first wiring layer 61 is formed so as to be commonly in contact with upper surfaces of adjacent two of the source side columnar semiconductor layers 58, as shown in FIG. 4. The first wiring layer 61 is formed in stripes extending in the row direction and having a certain pitch in the column direction. The first wiring layer 61 is constituted by a metal such as tungsten (W).

The second wiring layer 62 is connected to an upper surface of the drain side columnar semiconductor layer 57 via the plug layer 63, as shown in FIG. 4. The second wiring layer 62 is formed in stripes extending in the column direction and having a certain pitch in the row direction. The second wiring layer 62 is constituted by a metal such as copper (Cu), and the plug layer 63 is constituted by a metal such as tungsten (W).

[First Read Operation]

Figure 6:
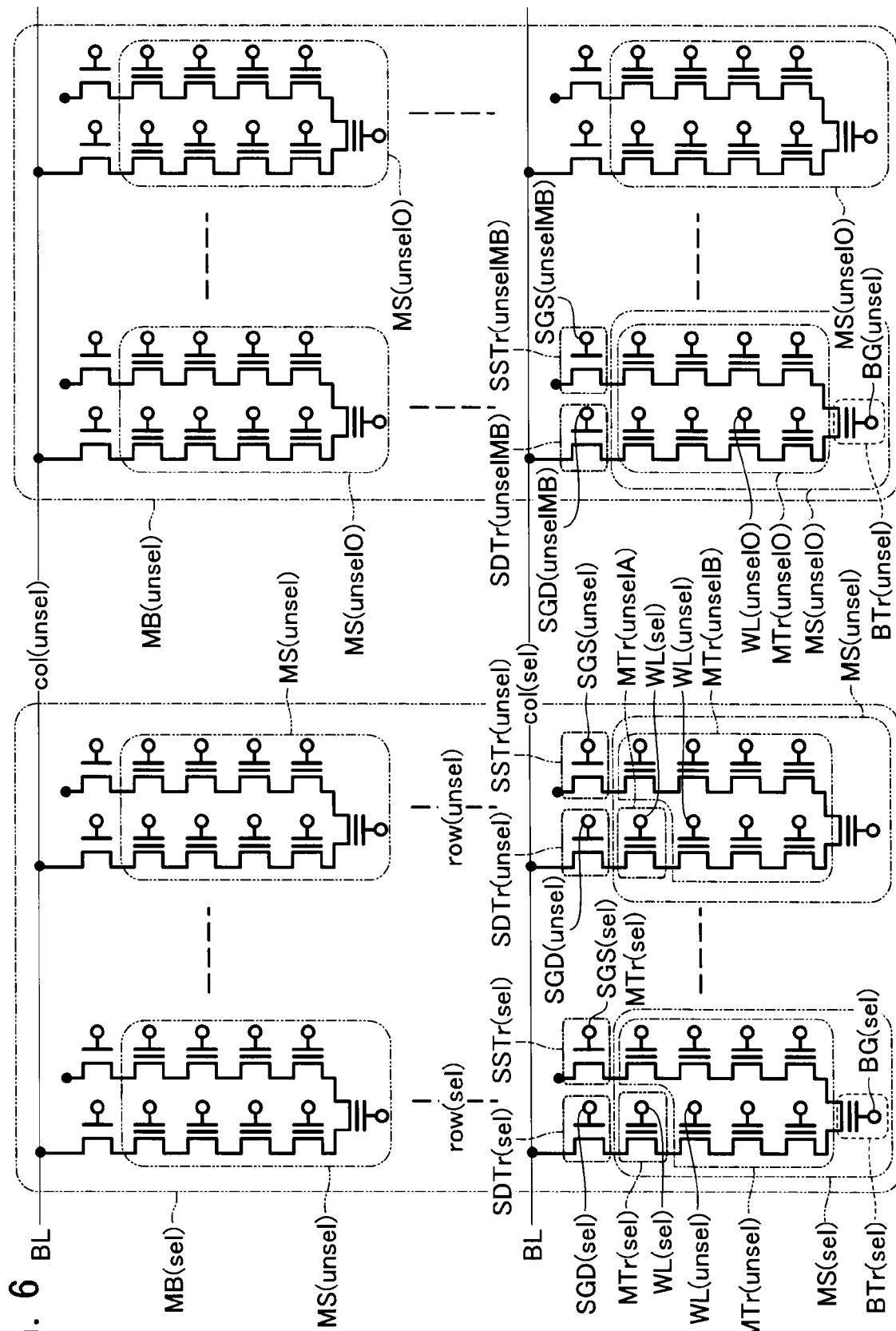
FIG. 6 is an equivalent circuit diagram showing the memory cell array 11 during a first read operation in the nonvolatile semiconductor memory device in accordance with the first embodiment.

Next, a first read operation in the nonvolatile semiconductor memory device in accordance with the first embodiment is described. The first read operation is executed on a selected memory transistor MTr(sel) included in a selected memory string MS(sel) in a selected memory block MB(sel), as shown in FIG. 6. The selected memory string MS(sel) lies in a selected row row(sel) and a selected column col(sel). Note that an unselected memory string MS(unsel) in the selected memory block MB(sel) lies outside of the selected row row (sel) and the selected column col(sel).

Before beginning description of the first read operation, names of each portion are first specified, as shown in FIG. 6. Connected to a gate of the selected memory transistor MTr (sel) in the selected memory string MS (sel) is a word line WL (sel). At the same time, connected to a gate of the unselected memory transistor MTr(unsel) in the selected memory string MS(sel) is a word line WL(unsel). Note that a memory transistor MTr(unselA) in the same positional relationship as the selected memory transistor MTr(sel) in the unselected memory string MS(unsel) is commonly connected to the word line WL(sel). Moreover, a memory transistor MTr(unselB) in the same positional relationship as the unselected memory transistor MTr(unsel) in the unselected memory string MS(unsel) is commonly connected to the word line WL(unsel).

In addition, connected to a gate of an unselected memory transistor MTr(unselO) included in an unselected memory string MS(unselO) in an unselected memory block MB(unsel) is a word line WL(unselO), as shown in FIG. 6. Note that all memory strings in the unselected memory block MB(unsel) are unselected memory strings MS(unselO), and that all memory transistors in the unselected memory string MS(unselO) are unselected memory transistors MTr(unselO).

Moreover, connected to a gate of a back gate transistor BTr(sel) in the selected memory block MB(sel) is a back gate line BG(sel), as shown in FIG. 6. Connected to a gate of a back gate transistor BTr(unsel) in the unselected memory block MB(unsel) is a back gate line BG(unsel). Note that all back gate transistors in the selected memory block MB(sel) are back gate transistors BTr(sel), and that all back gate transistors in the unselected memory block MB(unsel) are back gate transistors BTr(unsel).

In addition, connected to a gate of a drain side select transistor SDTr(sel) connected to the selected memory string MS (sel) lying in the selected row row(sel) is a drain side select gate line SGD(sel), as shown in FIG. 6. At the same time, connected to a gate of a drain side select transistor SDTr (unsel) connected to the unselected memory string MS(unsel) lying in an unselected row row(unsel) in the selected memory block MB(sel) is a drain side select gate line SGD(unsel). Moreover, connected to a gate of a drain side select transistor SDTr(unselMB) in the unselected memory block MB(unsel) is a drain side select gate line SGD(unselMB).

Similarly, connected to a gate of a source side select transistor SSTr(sel) connected to the selected memory string MS (sel) lying in the selected row row(sel) is a source side select gate line SGS(sel), as shown in FIG. 6. At the same time, connected to a gate of a source side select transistor SSTr (unsel) connected to the unselected memory string MS(unsel) lying in the unselected row row(unsel) in the selected memory block MB(sel) is a source side select gate line SGS (unsel). Moreover, connected to a gate of a source side select transistor SSTr(unselMB) in the unselected memory block MB(unsel) is a source side select gate line SGS(unselMB).

Figure 7:
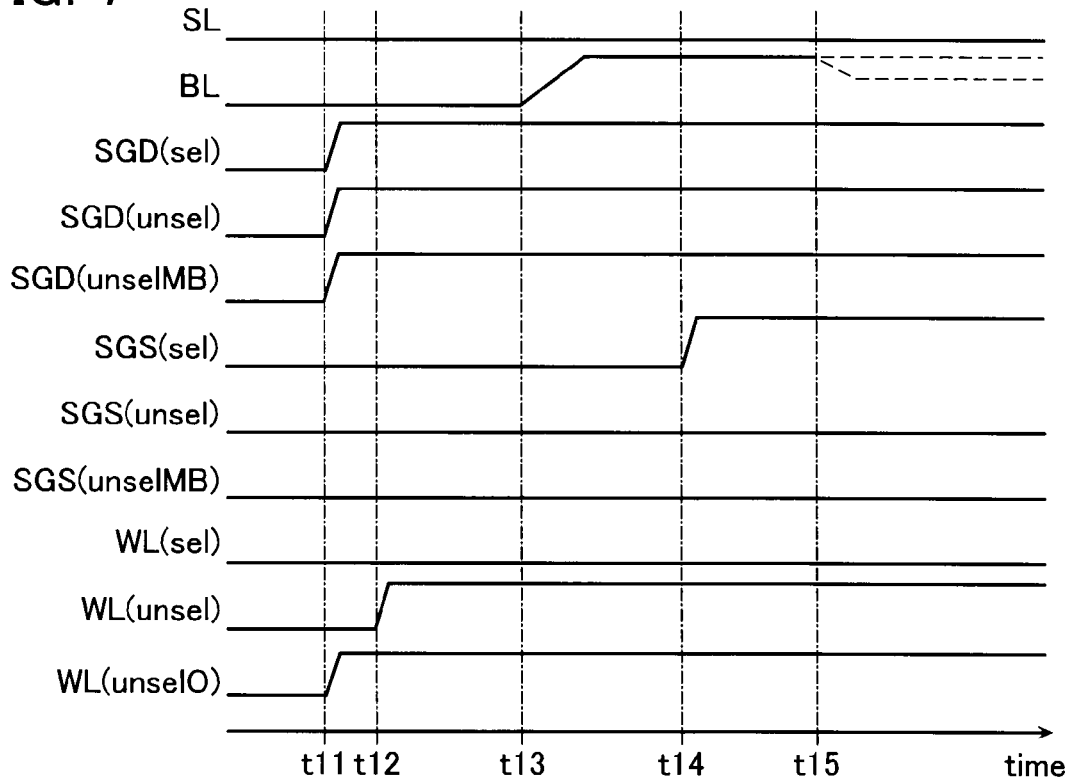
FIG. 7 is a timing chart showing the first read operation in the nonvolatile semiconductor memory device in accordance with the first embodiment.

First, in advance of the first read operation, the control circuit 15 sets all the lines SGD, SGS, WL, BG, BL, and SL to a ground voltage Vss, as shown in FIG. 7.

Next, at time t11, the control circuit 15 raises the drain side select gate lines SGD(sel), SGD(unsel), and SGD(unselMB) to a voltage Von. The drain side select transistors SDTr(sel), SDTr(unsel), and SDTr(unselMB) are thereby rendered conductive.

Additionally at time t11, the control circuit 15 raises the word line WL(unselO) to a voltage Vread. As a result, the unselected memory transistor MTr(unselO) is rendered conductive, and a body of the unselected memory transistor MTr (unselO) attains the same potential as the bit line BL. On the other hand, at time t11, the source side select transistors SSTr(unsel) and SSTr(unselMB) are held in a non-conductive state. Note that, at time t11, the control circuit 15 raises the back gate line BG(unsel) to the voltage Vread (not shown), whereby the back gate transistor BTr(unsel) is rendered conductive.

Subsequently, at time t12, the control circuit 15 raises the word line WL(unsel) to the voltage Vread. The unselected memory transistors MTr(unsel) and MTr(unselB) are thereby rendered conductive. Note that, at time t12, the control circuit 15 raises the back gate line BG(sel) to the voltage Vread (not shown), whereby the back gate transistor BTr(sel) is rendered conductive.

Next, at time t13, the control circuit 15 raises the bit line BL lying in the selected column col(sel) to a voltage Vbl.

As a result, when the body of the unselected memory transistor MTr(unselO) is charged to the same potential as the bit line BL, a potential difference between source and drain in the drain side select transistor SDTr(unselMB) becomes small, thereby enabling a leak current in the drain side select transistor SDTr(unselMB) to be curbed.

On the other hand, when the body of the unselected memory transistor MTr(unselO) is charged to the same potential as the bit line BL, a potential difference between source and drain in the source side select transistor SSTr(unselMB) becomes large. However, the impurity concentration of the lower portion 58B (side near the U-shaped semiconductor layer 45) of the source side columnar semiconductor layer 58 is lower than that of the upper portion (side near the source line SL) thereof by an order of magnitude or more, and is $3 \times 10^{18}$ cm$^{-3}$. Consequently, the source side select transistor SSTr has excellent cut-off characteristics compared to the drain side select transistor SDTr and is able to curb the leak current.

Subsequently, at time t14, the control circuit 15 raises the source side select gate line SGS(sel) to the voltage Von. The source side select transistor SSTr(sel) is thereby rendered conductive.

Next, at time t15, the control circuit 15 causes the sense amplifier 13 to detect a current flowing from the selected memory string MS(sel) to the source line SL. The read operation is thereby completed.

As shown above in FIG. 7, during reading of data from the selected memory string MS(sel), the memory transistor MTr (unselO) included in the unselected memory string MS(unselO), and the drain side select transistors SDTr(unsel) and SDTr(unselMB) connected to the unselected memory strings MS(unsel) and MS(unselO) are all rendered conductive by the control circuit 15. On the other hand, the source side select transistors SSTr(unsel) and SSTr(unselMB) connected to the unselected memory strings MS(unsel) and MS(unselO) are rendered non-conductive by the control circuit 15. Thereby, the leak current can be curbed, as mentioned above.

[Second Read Operation]

Figure 8:
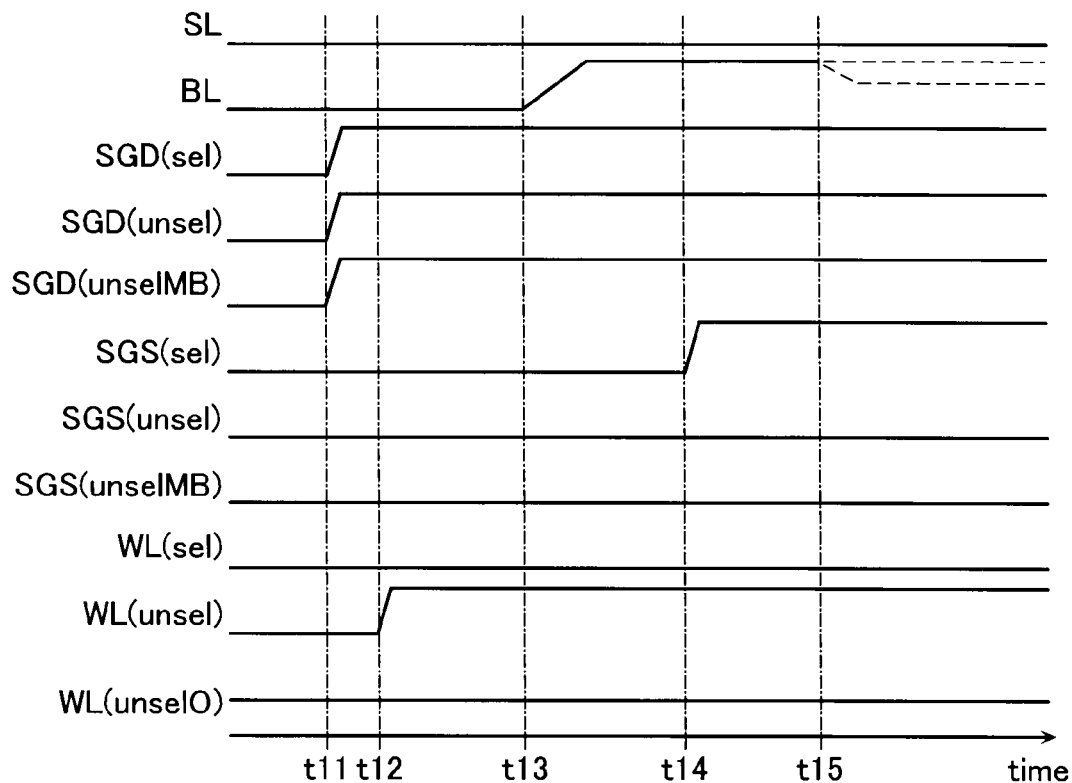
FIG. 8 is a timing chart showing a second read operation in the nonvolatile semiconductor memory device in accordance with the first embodiment.

Next, a second read operation in the nonvolatile semiconductor memory device in accordance with the first embodiment is described with reference to FIG. 8. In the first read operation shown in FIG. 7, the control circuit 15 raises the word line WL(unselO) to the voltage Vread at time t11. In contrast, in the second read operation, the control circuit 15 holds the word line WL(unselO) at the ground voltage Vss at time t11 and thereafter, as shown in FIG. 8. Note that, at time t11 and thereafter, the control circuit 15 holds the back gate line BG(unsel) at the ground voltage Vss (not shown).

That is, as shown above in FIG. 8, during reading of data from the selected memory string MS(sel), the drain side select transistors SDTr(unsel) and SDTr(unselMB) are rendered conductive by the control circuit 15. On the other hand, the source side select transistors SSTr(unsel) and SSTr(unselMB) are rendered non-conductive by the control circuit 15. However, the unselected memory transistor MTr(unselO) and the back gate transistor BTr(unsel) are rendered non-conductive by the control circuit 15. The second read operation differs from the first read operation in this point.

Moreover, in the above-described first and second read operations, voltages of the word line WL and the drain side select gate line SGD are raised, followed by raising a voltage of the bit line BL. However, in this case, there is a risk that a voltage Vread-Vss is temporarily applied to the unselected memory block MB(unsel), whereby deterioration of "1" data occurs. Accordingly, if the voltages of the lines are controlled by a following first sequence or second sequence, a useful advantage can sometimes be achieved. That is, in the first sequence, the voltage of the bit line BL is raised, followed by raising the voltage in the word line WL and the drain side select gate line SGD. In the second sequence, the voltage is raised in order of the drain side select gate line SGD, the bit line BL, and the word line WL. The voltage applied to the unselected memory block MB(unsel) is thereby lessened to a voltage Vread-Vbl, enabling achievement of a high reliability in data storage characteristics.

[Erase Operation]

Next, an erase operation in the nonvolatile semiconductor memory device in accordance with the first embodiment is described. The control circuit 15 fixes the word lines WL in the selected memory block MB(sel) to the voltage Vss, and sets the word lines WL in the unselected block MB(unsel) to a floating state. Next, the control circuit 15 applies a voltage Verase to the source line SL, and a voltage VeraseG to the drain side select gate line SGD and the source side select gate line SGS (Verase>VeraseG>Vss). A potential difference between the source line SL and the source side select gate line SGS generated thereby is utilized to execute the erase operation. Specifically, an intense electric field occurs in the upper portion 58A (high impurity concentration layer) of the source side columnar semiconductor layer 58 shown in FIG. 5, whereby holes are generated therein. The control circuit 15 injects these holes into the charge storage layer of the memory transistors MTr to erase the data.

[Advantages]

During the first and second read operations in the nonvolatile semiconductor memory device in accordance with the first embodiment, the drain side select transistors SDTr(unsel) and SDTr(unselMB) are rendered conductive, and the source side select transistors SSTr(unsel) and SSTr(unselMB) are rendered non-conductive, as shown in FIGS. 6-8.

Here, the impurity concentration of the upper portion 57A (side near the bit line BL) of the drain side columnar semiconductor layer 57 is higher than that of the lower portion 57B thereof, and is $1 \times 10^{19}$ cm$^{-3}$ or more. As a result, the cut-off characteristics of the drain side select transistor SDTr are poor. Consequently, during the read operations in the first embodiment, the drain side select transistors SDTr(unsel) and SDTr(unselMB) are rendered conductive, and bodies thereof charged to a certain potential. On the other hand, the impurity concentration of the lower portion 58B (side near the U-shaped semiconductor layer 45) of the source side columnar semiconductor layer 58 is lower than that of the upper portion 58A (side near the bit line BL) thereof by an order of magnitude or more, and is $3 \times 10^{18}$ cm$^{-3}$ or less. As a result, the cut-off characteristics of the source side select transistor SSTr are good. Consequently, during the read operations in the first embodiment, the source side select transistors SSTr(unsel) and SSTr(unselMB) are rendered non-conductive, whereby the leak current can be curbed.

In addition, during the read operations in the nonvolatile semiconductor memory device in accordance with the first embodiment, the drain side select transistors SDTr are rendered conductive. As a result, the impurity concentration of the drain side columnar semiconductor layer 57 can be set high for generating holes during the erase operation, and does not need to be limited by considerations of the cut-off characteristics of the drain side select transistor SDTr.

Moreover, in the above-described first embodiment, the holes required in the erase operation can be easily generated due to the upper portion 58A (high impurity concentration layer) of the source side columnar semiconductor layer 58, or the upper portion 57A (high impurity concentration layer) of the drain side columnar semiconductor layer 57.

[Second Embodiment]
[Configuration]

Next, a nonvolatile semiconductor memory device in accordance with a second embodiment is described. The nonvolatile semiconductor memory device in accordance with the second embodiment has a stacking structure and circuit configuration similar to those of the first embodiment, and differs from the first embodiment only in a read operation. Note that in the second embodiment, identical symbols are assigned to configurations similar to those in the first embodiment and descriptions thereof are omitted.

[Read Operation]

The read operation in the nonvolatile semiconductor memory device in accordance with the second embodiment is described with reference to FIG. 9.

Figure 9:
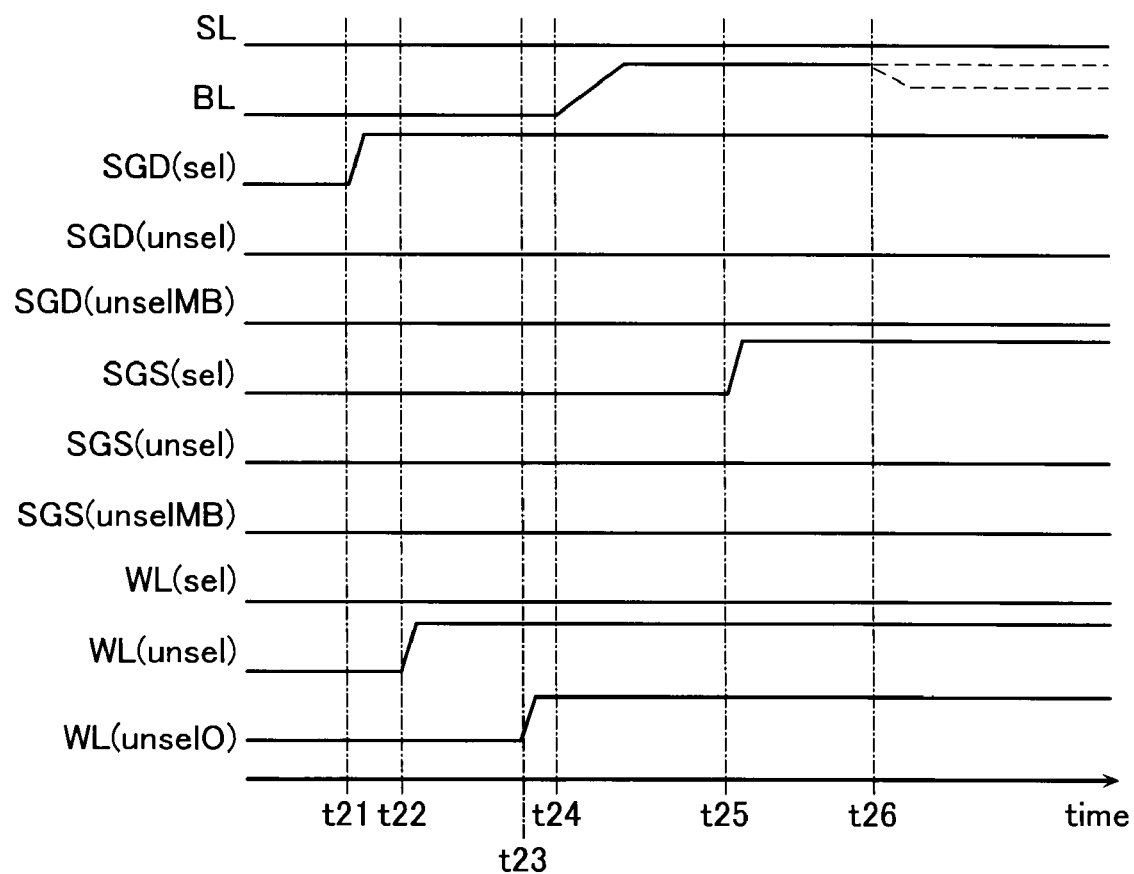
FIG. 9 is a timing chart showing a read operation in a nonvolatile semiconductor memory device in accordance with a second embodiment.

First, at time t21, the control circuit 15 raises only the drain side select gate line SGD(sel) to the voltage Von, as shown in FIG. 9. The drain side select transistor SDTr(sel) is thereby rendered conductive. Note that the drain side select transistors SDTr(unsel) and SDTr(unselMB) are held in a non-conductive state.

Next, at time t22, the control circuit 15 raises the word lines WL(unsel) to the voltage Vread, similarly to time t12 in the first embodiment. The unselected memory transistors MTr(unsel) and MTr(unselB) are thereby rendered conductive. Note that, at time t22, the control circuit 15 raises the back gate line BG(sel) to the voltage Vread (not shown), whereby the back gate transistor BTr(sel) is rendered conductive.

Then, at time t23, the control circuit 15 raises the word lines WL(unselO) to the voltage Vb1. Bodies of the unselected memory transistors MTr(unselO) are thereby boosted to a voltage near the voltage Vb1 due to capacitive coupling with the word lines WL(unselO). Note that the word lines WL(unselO) are connected, respectively, to gates of the unselected memory transistors MTr(unselO). Additionally at time t23, the control circuit 15 raises the back gate line BG(unsel) to the voltage Vread (not shown), whereby a body of the back gate transistor BTr(unsel) is boosted to a voltage near the voltage Vb1 due to capacitive coupling with the back gate line BG(unsel).

Next, at time t24, the control circuit 15 raises the bit line BL lying in the selected column col(sel) to the voltage Vb1, similarly to time t13 in the first embodiment.

Subsequently, at times t25 and t26, the control circuit 15 executes operations similar to those at times t14 and t15 in the first embodiment.

[Advantages]

A comparison is now made between a comparative example shown below and the above-described second embodiment. During a read operation in the comparative example, the drain side select transistors SDTr(unselMB) and the source side select transistors SSTr(unselMB) connected to the unselected memory strings MS(unselO) are rendered non-conductive. Furthermore, the unselected memory transistors MTr(unselO) included in the unselected memory strings MS(unselO) are rendered non-conductive.

In contrast to this comparative example, in the second embodiment, the bodies of the unselected memory transistors MTr(unselO) included in the unselected memory strings MS(unselO) are boosted to the voltage Vb1 due to capacitive coupling with the word lines WL(unselO). As a result, a potential difference between the bodies of the unselected memory transistors MTr(unselO) and the bit line BL becomes small. Consequently, a potential difference between source and drain in the drain side select transistors SDTr(unselMB) also becomes small, whereby the leak current can be curbed more in the second embodiment than in the comparative example.

Moreover, in the second embodiment, the holes required in the erase operation can be easily generated due to the upper portion 58A (high impurity concentration layer) of the source side columnar semiconductor layer 58, or the upper portion 57A (high impurity concentration layer) of the drain side columnar semiconductor layer 57, similarly to the first embodiment.

[Other Embodiments]

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

For example, the above-described embodiments include a U-shaped semiconductor layer 45, but the present invention may include an I-shaped semiconductor layer extending in the stacking direction as viewed in cross-section in place of the U-shaped semiconductor layer 45 (refer to Japanese Unexamined Patent Application Publication No. 2007-266143). For example, subsequent to time t15 in FIG. 7 of the first embodiment, the drain side select transistors SDTr(unsel) and SDTr(unselMB) may be rendered non-conductive. The above-described operation sometimes causes the leak current to be further curbed. Selection of whether or not to render the drain side select transistors SDTr(unsel) and SDTr(unselMB) non-conductive should be made depending on a magnitude of capacitance coupling between the drain side select gate line SGS and the bit line BL.

What is claimed is:

1. A nonvolatile semiconductor memory device, comprising:
a bit line;
a source line;
a memory string having a plurality of electrically data-rewritable memory transistors connected in series;
a first select transistor provided between one end of the memory string and the bit line;
a second select transistor provided between another end of the memory string and the source line; and
a control circuit configured to control a read operation,
a plurality of the memory strings being connected to one bit line via a plurality of the first select transistors,
the memory string comprising:
a first semiconductor layer including a columnar portion extending in a stacking direction on a substrate and functioning as a body of the memory transistors;
a first charge storage layer surrounding the columnar portion and holding data of the memory transistors by storing a charge; and
a plurality of first conductive layers stacked on the substrate so as to surround the first charge storage layer and functioning as gates of the memory transistors,
the first select transistor comprising:
a second semiconductor layer in contact with an end of the columnar portion and extending in the stacking direction, and functioning as a body of the first select transistor;
a first gate insulating layer surrounding the second semiconductor layer; and
a second conductive layer surrounding the first gate insulating layer and functioning as a gate of the first select transistor,
and
the second select transistor comprising:
a third semiconductor layer in contact with an end of the columnar portion and extending in the stacking direction, and functioning as a body of the second select transistor;
a second gate insulating layer surrounding the third semiconductor layer; and
a third conductive layer surrounding the second gate insulating layer and functioning as a gate of the second select transistor,
during reading of data from a selected one of the memory strings, the control circuit being configured to render conductive the first select transistor connected to an unselected one of the memory strings and render non-conductive the second select transistor connected to unselected one of the memory strings.

2. The nonvolatile semiconductor memory device according to claim 1,
wherein an impurity concentration in a first portion of the second semiconductor layer is higher than an impurity concentration in a second portion of the second semiconductor layer, the first portion being closer to the bit line than the second portion, the second portion being closer to the first semiconductor layer than the first portion.

3. The nonvolatile semiconductor memory device according to claim 1,
wherein an impurity concentration in a third portion of the third semiconductor layer is higher than an impurity concentration in a fourth portion of the third semiconductor layer, the third portion being closer to the source line than the fourth portion, the fourth portion being closer to the first semiconductor layer than the third portion.

4. The nonvolatile semiconductor memory device according to claim 1,
wherein an impurity concentration in a first portion of the second semiconductor layer is higher than an impurity concentration in a second portion of the second semiconductor layer, the first portion being closer to the bit line than the second portion, the second portion being closer to the first semiconductor layer than the first portion, and
wherein an impurity concentration in a third portion of the third semiconductor layer is higher than an impurity concentration in a fourth portion of the third semiconductor layer, the third portion being closer to the source line than the fourth portion, the fourth portion being closer to the first semiconductor layer than the third portion.

5. The nonvolatile semiconductor memory device according to claim 1,
wherein, during reading of data from the selected one of the memory strings, the control circuit renders conductive the memory transistors included in the unselected one of the memory strings.

6. The nonvolatile semiconductor memory device according to claim 5,
wherein an impurity concentration in a first portion of the second semiconductor layer is higher than an impurity concentration in a second portion of the second semiconductor layer, the first portion being closer to the bit line than the second portion, the second portion being closer to the first semiconductor layer than the first portion.

7. The nonvolatile semiconductor memory device according to claim 5,
wherein an impurity concentration in a third portion of the third semiconductor layer is higher than an impurity concentration in a fourth portion of the third semiconductor layer, the third portion being closer to the source line than the fourth portion, the fourth portion being closer to the first semiconductor layer than the third portion.

8. The nonvolatile semiconductor memory device according to claim 5,
wherein an impurity concentration in a first portion of the second semiconductor layer is higher than an impurity concentration in a second portion of the second semiconductor layer, the first portion being closer to the bit line than the second portion, the second portion being closer to the first semiconductor layer than the first portion, and
wherein an impurity concentration in a third portion of the third semiconductor layer is higher than an impurity concentration in a fourth portion of the third semiconductor layer, the third portion being closer to the source line than the fourth portion, the fourth portion being closer to the first semiconductor layer than the third portion.

9. The nonvolatile semiconductor memory device according to claim 1,
wherein, during reading of data from the selected one of the memory strings, the control circuit renders non-conductive the memory transistors included in the unselected one of the memory strings.

10. The nonvolatile semiconductor memory device according to claim 9,
wherein an impurity concentration in a first portion of the second semiconductor layer is higher than an impurity concentration in a second portion of the second semiconductor layer, the first portion being closer to the bit line than the second portion, the second portion being closer to the first semiconductor layer than the first portion.

11. The nonvolatile semiconductor memory device according to claim 9,
wherein an impurity concentration in a third portion of the third semiconductor layer is higher than an impurity concentration in a fourth portion of the third semiconductor layer, the third portion being closer to the source line than the fourth portion, the fourth portion being closer to the first semiconductor layer than the third portion.

12. The nonvolatile semiconductor memory device according to claim 1,
wherein the memory string comprises a back gate transistor provided between the memory transistors, and
wherein the back gate transistor comprises:
a joining portion joining lower ends of a pair of the columnar portions and functioning as a body of the back gate transistor; and
a fourth conductive layer surrounding the joining portion and functioning as a gate of the back gate transistor.

13. The nonvolatile semiconductor memory device according to claim 12,
wherein, during reading of data from the selected one of the memory strings, the control circuit renders conductive the back gate transistor included in the unselected one of the memory strings.

14. The nonvolatile semiconductor memory device according to claim 12,
wherein, during reading of data from the selected one of the memory strings, the control circuit renders non-conductive the back gate transistor included in the unselected one of the memory strings.

15. A nonvolatile semiconductor memory device, comprising:
a bit line;
a source line;
a memory string having a plurality of electrically data-rewritable memory transistors connected in series;
a first select transistor provided between one end of the memory string and the bit line;
a second select transistor provided between another end of the memory string and the source line; and
a control circuit configured to control a read operation,
a plurality of the memory strings being connected to one bit line via a plurality of the first select transistors,
the memory string comprising:
a first semiconductor layer including a columnar portion extending in a stacking direction on a substrate and functioning as a body of the memory transistors;
a first charge storage layer surrounding the columnar portion and holding data of the memory transistors by storing a charge; and
a plurality of first conductive layers stacked on the substrate so as to surround the first charge storage layer and functioning as gates of the memory transistors,
the first select transistor comprising:
a second semiconductor layer in contact with an end of the columnar portion and extending in the stacking direction, and functioning as a body of the first select transistor;
a first gate insulating layer surrounding the second semiconductor layer; and
a second conductive layer surrounding the first gate insulating layer and functioning as a gate of the first select transistor,
and
the second select transistor comprising:
a third semiconductor layer in contact with an end of the columnar portion and extending in the stacking direction, and functioning as a body of the second select transistor;
a second gate insulating layer surrounding the third semiconductor layer; and
a third conductive layer surrounding the second gate insulating layer and functioning as a gate of the second select transistor,
during reading of data from a selected one of the memory strings, the control circuit being configured to first render non-conductive the first select transistor and the second select transistor connected to an unselected one of the memory strings, and then apply a first voltage to a gate of the memory transistors included in the unselected one of the memory strings, thereby boosting the body of the memory transistors included in the unselected one of the memory strings by capacitive coupling.

16. The nonvolatile semiconductor memory device according to claim 15,
wherein an impurity concentration in a first portion of the second semiconductor layer is higher than an impurity concentration in a second portion of the second semiconductor layer, the first portion being closer to the bit line than the second portion, the second portion being closer to the first semiconductor layer than the first portion.

17. The nonvolatile semiconductor memory device according to claim 15,
wherein an impurity concentration in a third portion of the third semiconductor layer is higher than an impurity concentration in a fourth portion of the third semiconductor layer, the third portion being closer to the source line than the fourth portion, the fourth portion being closer to the first semiconductor layer than the third portion.

18. The nonvolatile semiconductor memory device according to claim 15,
wherein an impurity concentration in a first portion of the second semiconductor layer is higher than an impurity concentration in a second portion of the second semiconductor layer, the first portion being closer to the bit line than the second portion, the second portion being closer to the first semiconductor layer than the first portion, and wherein an impurity concentration in a third portion of the third semiconductor layer is higher than an impurity concentration in a fourth portion of the third semiconductor layer, the third portion being closer to the source line than the fourth portion, the fourth portion being closer to the first semiconductor layer than the third portion.

19. The nonvolatile semiconductor memory device according to claim 15, wherein the memory string comprises a back gate transistor provided between the memory transistors, and wherein the back gate transistor comprises:

a joining portion joining lower ends of a pair of the columnar portions and functioning as a body of the back gate transistor; and a fourth conductive layer surrounding the joining portion and functioning as a gate of the back gate transistor.

20. The nonvolatile semiconductor memory device according to claim 19, wherein, during reading of data from the selected one of the memory strings, the control circuit applies a first voltage to a gate of the back gate transistor included in the unselected one of the memory strings, thereby boosting the body of the back gate transistor included in the unselected one of the memory strings by capacitive coupling.

* * * * *